(12) United States Patent
Kranawetter et al.

(10) Patent No.: US 6,668,015 B1
(45) Date of Patent: Dec. 23, 2003

(54) EFFICIENT FIXED-LENGTH BLOCK COMPRESSION AND DECOMPRESSION

(75) Inventors: Greg Alan Kranawetter, San Jose, CA (US); Mark Alan Schultz, Carmel, IN (US)

(73) Assignee: Thomson Licensing S.A., Cedex (FR)

( * ) Notice: Subject to any disclaimer, the term of this patent is extended or adjusted under 35 U.S.C. 154(b) by 0 days.

(21) Appl. No.: 09/319,215

(22) PCT Filed: Sep. 30, 1997

(86) PCT No.: PCT/US97/17470

§ 371 (c)(1),
(2), (4) Date: Jun. 1, 1999

(87) PCT Pub. No.: WO98/27734

PCT Pub. Date: Jun. 25, 1998

(30) Foreign Application Priority Data

Dec. 18, 1996 (EP) .............................................. 96402785

(51) Int. Cl.[7] ................................................. H04N 7/12
(52) U.S. Cl. .............................. 375/240.12; 375/240.23
(58) Field of Search ........................... 375/240, 240.01, 375/240.12, 240.23, 240.24, 240.25; 348/390.1; 341/67; 380/217

(56) References Cited

U.S. PATENT DOCUMENTS

| | | | | |
|---|---|---|---|---|
| 5,111,292 A | * | 5/1992 | Kuriacose et al. | 375/240.01 |
| 5,122,875 A | * | 6/1992 | Raychaudhuri et al. | 348/390.1 |
| 5,321,398 A | * | 6/1994 | Ikeda | 341/67 |
| 5,631,644 A | * | 5/1997 | Katata et al. | 341/67 |
| 5,706,346 A | * | 1/1998 | Katta et al. | 380/217 |

* cited by examiner

*Primary Examiner*—Chris Kelley
*Assistant Examiner*—Allen Wong
(74) *Attorney, Agent, or Firm*—Joseph S. Tripoli; Ronald H. Kurdyla; Joel M. Fogelson

(57) ABSTRACT

Compression and decompression apparatus and methods for producing fixed-length compressed data blocks with variable-length compression are described. The compression system receives an N-bit word from a data block and determines the variable compression length for the word. A bit counter keeps track of the number of bits remaining and determines if sufficient bits have been used to ensure that the fixed-length compressed data block will be filled. If so, the compressed word is output. If not, prior to output the compressed word is padded with an appropriate number of bits, which may be null bits.

20 Claims, 2 Drawing Sheets

EFFICIENT FIXED-LENGTH BLOCK COMPRESSION AND DECOMPRESSION

FIELD OF THE INVENTION

This invention relates to efficient coding of data with an output block of fixed-length.

BACKGROUND OF THE INVENTION

Data compression is an important aspect of data transmission and storage. Known compression methods allow data to occupy less bandwidth or storage space without data loss or with acceptable data loss. There are several methods of data compression, both lossless and lossy, among them Huffman coding, quantization, and direct cosine transformation. The particular application will normally determine the compression method used.

For broadcast of image data requiring high data rates, JPEG and MPEG are two well known and well accepted data compression methods. In general, data transmitted or stored in these formats are transformed, quantized, and then variable-length compressed to meet the system bandwidth or storage requirements. Compressed data blocks are not limited to be any particular length. When the end of a data block occurs, an end-of-block (EOB) code or flag is attached to the data to alert the system of the end of the current data block and of the beginning of another one.

However, there are instances where data, such as image data, must be stored or transmitted in fixed-length blocks. Known systems using variable-length compression methods ensure the data compression is sufficient to fit within the allocated space for each data block. It is not uncommon for the compression to use less space or bandwidth than is allocated. In this case, known systems place an EOB code leaving the remaining space alone, or pad the remaining space with zeros or some other expected bit pattern. Placing an EOB code or zero padding causes the system data throughput to stop while the remaining block space is handled, thus reducing system efficiency.

As the data rate increases to the limit of the system throughput, placing an EOB code or zero padding may cause data overflow in buffers resulting in data skipping. Similar problems may exist during decompression, stopping data throughput and creating the same unwanted result. Therefore, it is advantageous to implement a system which will produce fixed-length compressed data blocks with variable-length compression which will utilize the storage space or output bandwidth efficiently, without stopping data flow by placing an EOB or zero padding remaining block space.

SUMMARY OF THE INVENTION

In accordance with the principles of the present invention, a compression system creating fixed-length output data compresses input data with variable-length compression. The variable-length compression will, on occasion, compress an input data block with fewer bits than allocated in the fixed-length output block. In these instances, the compression system will recognize that there is remaining output space during compression and will zero pad selected compressed data words, causing the final compressed data block length to equal the allocated output block length.

DETAILED DESCRIPTION OF THE PREFERRED EMBODIMENTS

The following description occurs in an MPEG compression system requiring fixed-length recompressed data blocks to be stored in frame memory. The choice of an MPEG system is not intended to be limiting. The invention may be applied to any compression system with input data capable of being formatted into blocks of fixed-length compressed output data.

Figure 1:
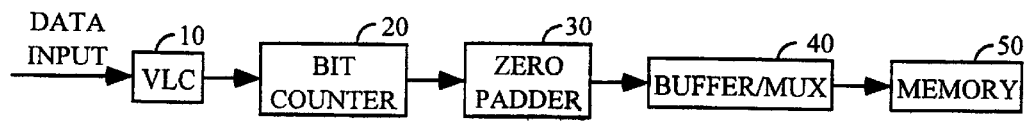
FIG. 1 shows an exemplary embodiment of the compression system according to the present invention.

FIG. 1 shows a compression system which will output compressed data blocks of predetermined fixed length. Variable-length compressor (VLC) 10 accepts block data from a source (not shown). The data may already be compressed to some degree, perhaps by discrete cosine transformation. VLC 10 may compress prediction data representative of differential pulse code modulation (DPCM) values or the like in a known manner. DPCM processing is known in the art and is beyond the scope of this discussion.

VLC 10 produces variable-length compressed data. For example, VLC 10 may quantize input data from eight bits to three, four, five, or six-bit words. The amount of compression depends upon variables such as the output network and the amount of data loss which is acceptable for the system. Three-bit compression is used, for example, when the value presented for compression is relatively small in value. Six-bit compression is used, for example, when the value presented for compression is relatively large in value. The value presented for compression generally depends upon the relative change in value of the incoming data within the context of a prediction network, for example.

For image data, for example, a frame containing negligible motion and/or subject matter will generally produce small prediction error values for compression. A frame containing a lot of motion and/or multiple subjects is more likely to produce larger prediction error values for compression, but will still produce small prediction error values as well.

As VLC 10 produces variable-length compressed data, Bit Counter 20 keeps track of the number of bits used over all and for each word of the incoming data block. If, for example, the output block may only use an average of four bits per word for each data block, and each block consists of eight-bit words in an eight by eight matrix, the fixed-length compressed data block output must be 256 bits. Longer or shorter output blocks will confuse the system and may result in contaminated data upon reconstruction. Four bits per word is a design parameter which exemplifies allowable data loss in a given compression system.

Bit counter 20 identifies when there are not sufficient bits remaining in the output block to maintain the four bits per compressed word average and tells VLC 10 to compress incoming words with three bits. Bit counter 20 also identifies when three bit compression has occurred too often for a given data block, and the remaining data words of a given block may be compressed with more than four bits each. In this case, when the compression system determines that compressing further data words with less than five bits provides acceptable results in terms of data loss parameters, bit counter sends a control signal to zero padder 30 and pads the end of the compressed word with zeros to exceed the four bit per word average at the rate determined by bit counter 20 to ensure the final compressed block will be the fixed length. The padded compressed word may be five or six bits within this exemplary system. An internal algorithm used by bit counter 20, and repeated in the decoder, determines how many bits to pad to the end.

The overall length of the padded compressed word may not exceed the length of the output register, shift register, or other implementing hardware transferring compressed data out of the compressor, however. By maintaining the maximum length of every compressed word to the length of the output register, a barrel shifter for example, data flow is not disrupted or stopped by the interspersed zero padding. In contrast, disrupted or stopped data flow is likely to occur when end-of-data zero filling is used, or when an EOB is attached to the end of the output data block. Stopping data flow to shift off end-of-block zero filling, or to reset pointers when an EOB is encountered requires added hardware and software which is unnecessary when data throughput is continuous.

The data register(s) handling the incoming data at the decoder/decompressor are the same length as the output register of the compressor. In the current example, both registers would be six bits long since the maximum compressed word length is six bits. If the maximum compressed word length is five bits, for example, then the registers handling compressed data would be five bits each. The common maximum word length reduces system complexity.

The compression system tracks the length of each compressed data word, and transfers the words into Buffer/Mux 40 either directly from bit counter 20 or from zero padder 30. Here, the data words are concatenated and appended by or to overhead information, if necessary. Bit counter 20 will compensate for overhead information when necessary by preserving the required number of bits during compression of the data. Buffer/Mux 40 transfers the compressed fixed-length data block to memory 50 for storage. Alternately, the fixed-length block may be transmitted if desired, or output to some other device or data path allowing fixed data length or fixed bandwidth.

Alternate embodiments include performing zero padding in VLC 10 or, if separate, passing compressed words not requiring zero padding through zero padder 30 without adding zeros, instead of bypassing element 30 as shown in FIG. 1.

When compressed data residing in memory 50 is needed for reconstruction, decompression occurs in a substantially inverse manner as that described above. Therefore, associated apparatus will not be further explained here. However, it is understood that the above zero padding is applicable and necessary to a decompressor receiving data so compressed. The algorithm used to track bit usage and send control signals to VLC 10 and zero padder 30 also has an inverse counterpart employed by the decompressor.

Figure 2:
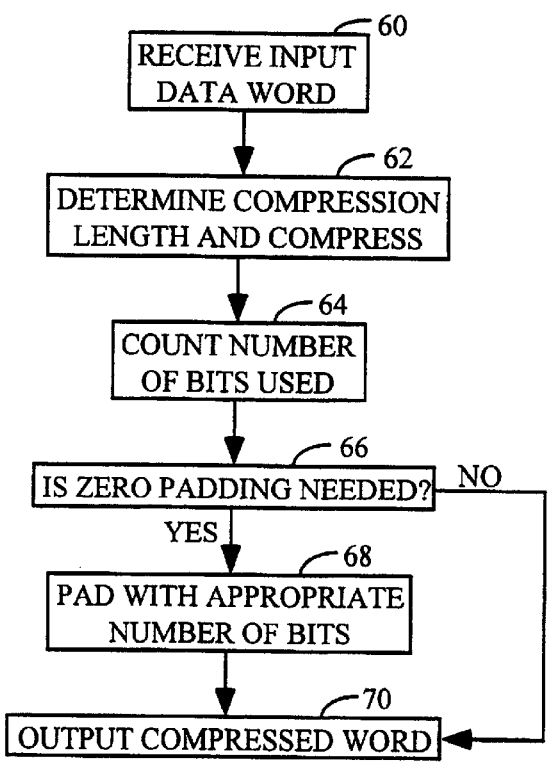
FIG. 2 is a flow chart describing data compression in the system of FIG. 1.
Figure 3:
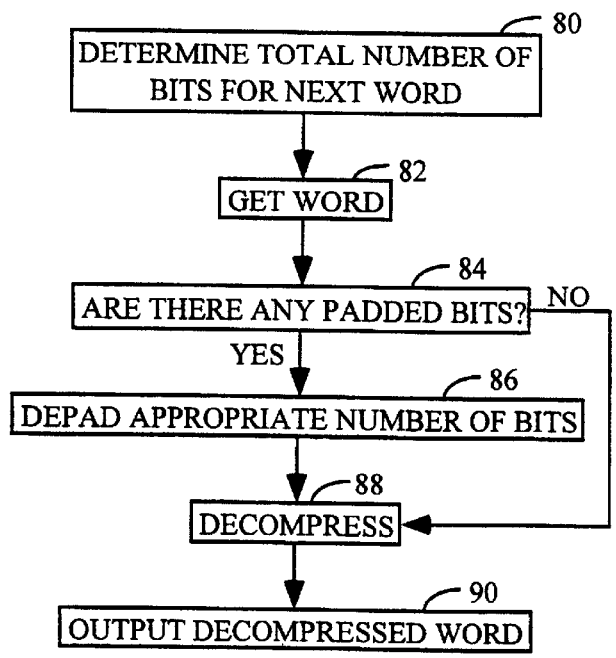
FIG. 3 is a flow chart describing data decompression associated with data compression as performed in the system of FIG. 1 and FIG. 2.

FIGS. 2 and 3 are flow charts describing the steps of data compression and decompression when selected words are zero padded to produce a fixed-length compressed data block. FIG. 2 is described first and refers to elements of FIG. 1.

In step 60, a data word of N bits is received at VLC 10. Step 62 evaluates the number of bits to be used to compress the received word and compresses the data word. The number of bits is determined by the algorithm which accounts for system dependent parameters, and the average number of bits per compressed word and the number of bits already used for the data block to which the current data word belongs. Once the compression length is determined, the word is compressed. The number of bits used for compression is included in various counters by bit counter 20 as determined by the compression algorithm in step 64. Next, if the word is less than the maximum length, the system determines if zero padding is necessary in step 66. If so, the appropriate number of bits are added to the word and counters are updated in step 68. Step 70 outputs the compressed word which may or may not be padded.

FIG. 3 describes the steps of decompressing the data word received from the compressor above which may or may not be zero padded. In step 80, the system determines if the total number of bits used for next word to be decompressed from the fixed-length data block. This includes padded bits. In step 82, the word is retrieved and the number of bits used is included in various counters tracking the decompression process according to the decompression algorithm. The number of padded bits if any is determined in step 84, and depadding occurs in step 86 if necessary. In step 88, the compressed word without padding is passed to the decompressor from the depadder or, if the word was not padded, from the input.

The word is decompressed to its original N bit length. Finally, the decompressed word is passed to an output network in step 90.

A compression/decompression system according to the principles of the present invention allows fixed-length compressed data blocks to be produced continuously without stopping data throughput and processing. If an EOB is placed at the end of each compressed block, data processing may stop to adjust pointers and perform other overhead functions. If data blocks are zero filled at the end to fill unused space, the system must use a sufficient number of clock cycles to shift out appended zeros, depending on the length of the shift register. An alternative would be to make the shift register appropriately large, but this increases system complexity and expense.

Figure 4:
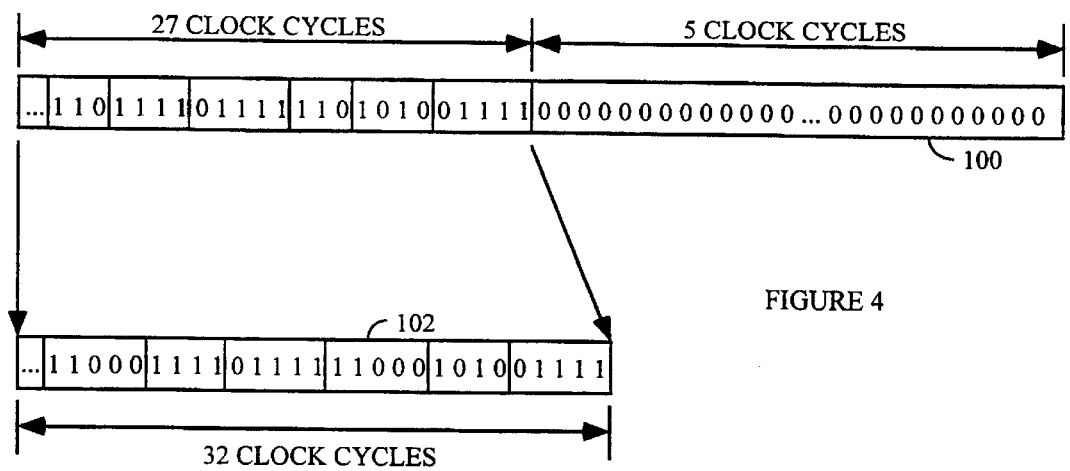
FIG. 4 illustrates a data stream produced by a system according to the present invention.

FIG. 4 illustrates the problem solved by the present invention. Shown are two data streams which are output from a compression network to memory, and input from memory to the decompression network. Data stream 100 includes zero filling at the end of the fixed-length data block. Data stream 102 illustrates interspersed zero padding in accordance with the principles of the present invention as described above. The compressed data streams may be compressed by fifty percent, for example. For an eight by eight data block, each word having eight bits, fifty percent compression translates to 256 bits for each fixed-length block. The data is still shifted in and out of memory by the multiplexers in eight-bit pieces. Therefore, 32 clock cycles are required for transferring the data to and from memory in a fifty percent compression network. Data streams 100 and 102 include demarcations indicating bits which represent individual compressed data words, and not the number of bits shifted in one clock cycle.

Upon decompression, the data must be decompressed from the variable bit format back to eight-bit data words. In data stream 100 the first 27 clock cycles contain all of the data information, and the last five clock cycles are zero filled to satisfy the fixed block length requirement. The decompressor will output 64 eight-bit values in 64 clock cycles with data from 27 input clock cycles. The remaining five input clock cycles containing zeros must be shifted out of the buffer before the next data block is available. An alternative to shifting out the zeros would be to reset the buffer pointer to the next data block. Both require data throughput to stop; both require more complex hardware and software to get to the valid data. Furthermore, once data flow on the decompression side halts for sufficient time, the compression network will also stop processing data unless there is a sufficiently large buffer/memory space available to maintain processing.

Data stream 102 includes interspersed zero padding on selected data. Having the zero padding expands the valid data across all 32 clock cycles. As described above, the system controller knows how many bits represent the current data word being decompressed, including how many of the bits, if any, are zero padding. The zero padding is easily disregarded without slowing the system at this point. This allows the fixed-length data blocks to flow continuously and uninterrupted through both the compression and decompression networks. System complexity is reduced because the system utilizes the existing shift register/barrel shifter to move the individual variable bit-length compressed data words. As soon as bit 256 of one compressed data block is decompressed, bit 1 of the subsequent compressed data block is next in the data path ready to be retrieved.

Figure 5:
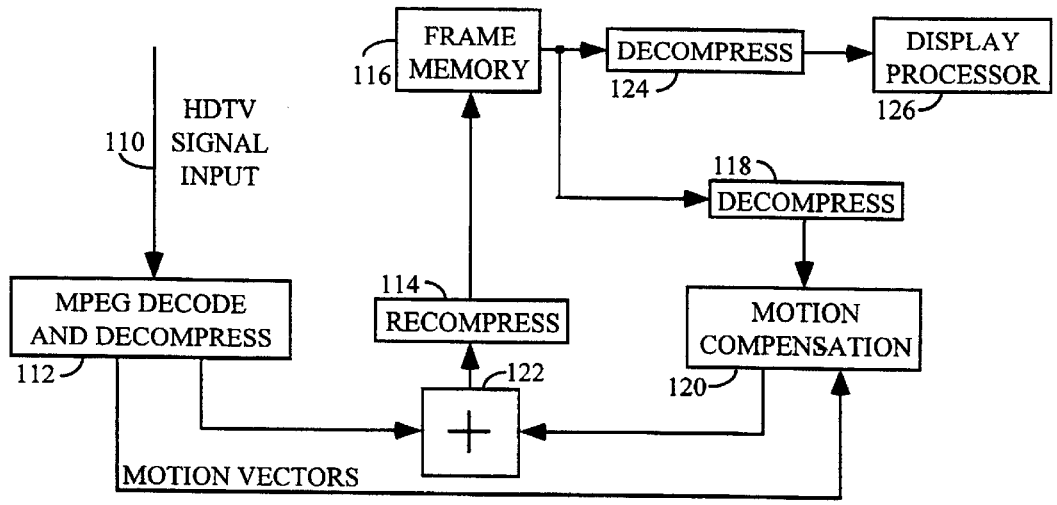
FIG. 5 shows an exemplary data processor in which the present invention may reside.

FIG. 5 illustrates and exemplary system in which the invention may be used. The system is an high definition television receiver capable of receiving, decoding, and displaying a high definition broadcast signal, in an MPEG format for example. The HDTV signal input 110 receives the demodulated signal and supplies it to be MPEG decoded and decompressed by element 112. Partially and fully decoded video data are passed to recompressor 114 which recompresses the data in the spatial domain to reduce the size of frame memory 116. Partially decoded data is stored in frame memory 116 while subsequently occurring data is decoded and decompressed. The partially decoded data is then retrieved from memory 116, decompressed by decompressor 118, processed by a motion compensation unit 120, and combined with the data from element 112 in summer 122 to reconstruct the finally decoded data. The motion compensation process forms predictions from previously decoded and decompressed pictures to produce finally decoded data samples, as known. Motion compensation is part of the MPEG standard relative to I, P, and B frames, and as such, it will not be discussed further here.

The finally decoded data is recompressed be recompressor 114 and stored in frame memory 116 until needed for reconstruction of subsequent frames as discussed above, and until needed for display. When recompressed data is needed for display, it is passed to decompressor 124 and restored to full bit-length pixel data. The pixel data is then passed to display processor 126 for display formatting and output to a display device (not shown).

The pixel data is processed as described above in 8×8 pixel blocks. The invention of FIGS. 1 and 2 resides on the compression side in recompressor 114, and on the decompression side in decompressors 118 and 124 (FIG. 3). Both decompressors are substantially identical in operation.

What is claimed is:

1. A data compression system outputting fixed-length block data, each block including a plurality of variable bit length data words, said system comprising:

an input for receiving N-bit data words as input data to be compressed;

a variable-length compressor coupled to said input for compressing said input data to variable length compressed data words having fewer than N bits, and having an output;

a bit counter coupled to said output for counting the number of bits resulting from compression of a predetermined amount of said input data; and a padder for adding one or more bits to a plurality of said selected compressed data words as a function of said bit counting by said bit counter so as to reformat said predetermined amount of data into fixed-length block data for output, wherein said padder adds said one or more bits at the end of said selected compressed data words.

2. The system of claim 1, further comprising:

means for concatenating said compressed data words into a compressed data block of said fixed-length.

3. The system of claim 1, wherein:

said input data comprises data blocks compressed into fixed-length data blocks by said system.

4. The system of claim 1, wherein:

said bit counter provides control signals to said variable-length compressor for determining said compression length of data words; and said bit counter provides control signal to said padder for selecting which compressed data words are padded and how many bits are padded to said selected compressed data words.

5. The system of claim 1, wherein:

said variable-length data compressor is a quantizer capable of outputting compressed data words of at least two bit lengths.

6. The system of claim 1, wherein:

said variable-length data compressor compresses prediction error values.

7. The system of claim 1, wherein:

said added bits are null bits.

8. A variable-length data decompression system responsive to fixed-length compressed block data each block including a plurality of variable bit length compressed data words, said system comprising:

an input for receiving compressed data words to be decompressed;

a bit counter coupled said input for counting the number of bits comprising a compressed data word, including any padding bits;

a depadder for stripping one or more padding bits from padded compressed data words as a function of said number of bits counted by said bit counter; and a variable-length data decompressor for receiving said compressed data words and decompressing said compressed data words to variable length decompressed data words.

9. The system of claim 8, wherein:

said bit counter indicates to said depadder how many bits are depadded from said compressed data words.

10. The system of claim 8, wherein:

said variable-length data decompressor is a dequantizer.

11. The system of claim 8, wherein:

said variable-length data decompressor decompresses prediction error values.

12. A method for compressing data to a fixed-length data block each block including a plurality of variable bit length data words, the steps comprising:

receiving a variable bit length data word to be compressed;

determining the variable bit length needed to represent said data word;

compressing said data word to said length to produce a compressed word;

determining if said compressed word is to be padded so as to provide said fixed-length data block; and padding said compressed word if so determined in said determining step, wherein said padding is added to the end of said data word.

13. A method for decompressing compressed data words received from a fixed-length compressed data block, each block including a plurality of variable bit length compressed data words, said compressed data block containing padded compressed words, the steps comprising:

determining the total number of bits used to represent a compressed data word;

retrieving said total number of bits;

determining if any of said total number of bits are padded bits;

removing said determined padded bits from said compressed data word, if any, wherein said padded bits may be at the end of said compressed data word; and decompressing said compressed data word.

14. In a system for processing a received digital data stream of fixed-length data blocks representing enhanced resolution video image information, a signal processing method comprising the steps of:

decoding and decompressing said video information to produce pixel data;

recompressing said pixel data to fixed-length data blocks; and padding selected recompressed pixel data as needed to fill said fixed-length data blocks, wherein said padding is interspersed within said pixel data.

15. The method of claim 14, further comprising the step:

storing recompressed data from said recompressing step in a frame memory.

16. The method of claim 14, wherein:

said digital data stream represents a high definition television signal.

17. The method of claim 14, wherein:

said recompression step is in an MPEG motion compensation network which produces a finally decoded and decompressed output.

18. The method of claim 14, wherein:

said recompressing step variable length compresses said pixel data.

19. The method of claim 14, wherein:

said padding required to fill the fixed-length data block is interspersed among pixels.

20. The method of claim 14, wherein:

said padding is null padding.

* * * * *